United States Patent [19]

Burrow

[11] 3,909,753

[45] Sept. 30, 1975

[54] ACOUSTIC SURFACE WAVE DEVICE

[75] Inventor: Norman George Burrow, Stockport, England

[73] Assignee: U.S. Philips Corporation, New York, N.Y.

[22] Filed: June 3, 1974

[21] Appl. No.: 475,663

[30] Foreign Application Priority Data

June 5, 1973 United Kingdom ............... 26728/73

[52] U.S. Cl. .................... 333/72; 310/8.2; 310/9.8; 333/30 R

[51] Int. Cl.².. H03H 9/02; H03H 9/26; H03H 9/32; H04R 17/10

[58] Field of Search.............. 333/30 R, 72; 310/8.1, 310/8.2, 9.7, 9.8

[56] References Cited

UNITED STATES PATENTS 3,801,935 4/1974 Mitchell ............................... 333/72

*Primary Examiner*—James W. Lawrence
*Assistant Examiner*—Marvin Nussbaum
*Attorney, Agent, or Firm*—Frank R. Trifari; Bernard Franzblau

[57] ABSTRACT

An acoustic surface wave device, including a launching transducer and a receiving transducer, is provided with a set of auxiliary electrodes in order to reduce undesired capacitive signal breakthrough between the transducers. The auxiliary electrodes are connected to opposite sides of one of the transducers and positioned in a direction approximately perpendicular to the direction of surface wave propagation.

5 Claims, 2 Drawing Figures

ACOUSTIC SURFACE WAVE DEVICE

Figure 1:
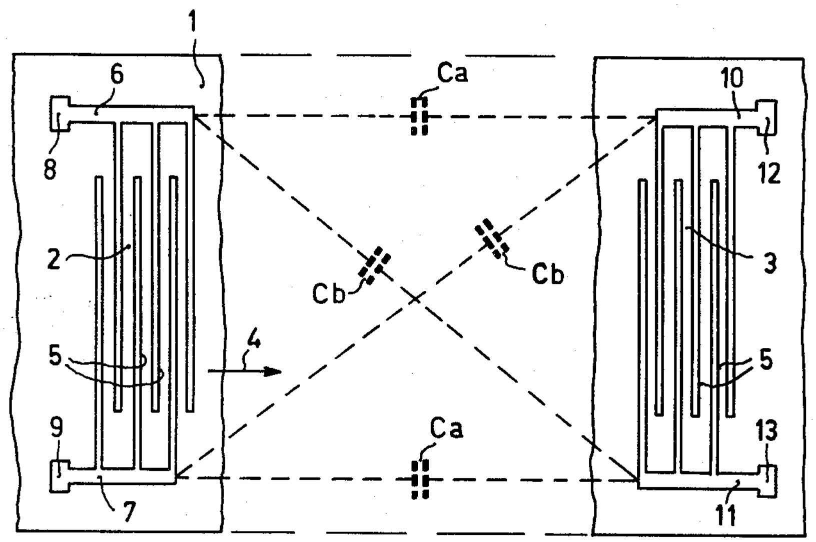
Fig.1 PRIOR ART

This invention relates to acoustic surface wave devices.

The use of acoustic surface waves has made it possible to manufacture devices, such as frequency selective filters, which are small, compact and are moreover compatible with integrated circuit manufacturing techniques. Such devices make it possible to avoid difficulties such as the bulk and manufacturing cost associated with the provision of inductors.

An acoustic surface wave filter is commonly formed by a thin wafer of piezoelectric material on one surface of which a launching and a receiving transducer are arranged respectively to launch and to receive an acoustic surface wave propagating over the surface. Each transducer normally comprises an interdigital array of parallel strip electrode pairs, the arrays being formed, for example, by a photolithographic process from a layer of a suitable metal, such as gold, deposited on the surface of the wafer.

The frequency response of the filter is determined by the number, spacing, and dimensional configuration of the electrodes making up each transducer. Each pair of adjacent electrodes can be regarded as a source of acoustic surface waves. However, for convenience of computation, a mathematical model of the array is considered in which each electrode is regarded as representing an individual acoustic surface wave source and the results obtained from this model are found to be satisfactory in practice for design purposes. By employing techniques of Fourier synthesis and computer optimisation which are mathematically analogous to diffraction theory, on this mathematical model, a suitable relative distribution of magnitude and spacing of such sources in the launching and receiving transducer arrays can be determined which can provide a good approximation to a desired band-pass response. The spacing of the launching and receiving transducers along the propagation direction of the acoustic surface waves will introduce a delay in the signal path. However, in many applications such a delay is not important or can be allowed for. For example, in the case of an intermediate frequency filter for a television receiver, since the entire received signal receives the same delay, this delay is simply equivalent to displacing the receiving aerial further from the transmitter. Alternatively this property of the device can be employed to provide a desired delay.

A problem with the above-described devices is that in addition to a wanted signal produced by the surface wave travelling from one transducer to the other there is also an unwanted breakthrough signal produced simply by capacitance between the launching transducer and the receiving transducer, the unwanted signal being moreover in advance of the wanted signal. In the case of a filter, the breakthrough level must be below the input signal by more than the insertion loss of the filter and the deepest required trap level of the filter combined.

An object of this invention is to provide an arrangement whereby unwanted capacitive signal breakthrough from the launching to the receiving transducer is substantially reduced.

According to the invention there is provided an acoustic surface wave device including a body of piezoelectric material on one surface of which is arranged a first and a second transducer for respectively launching and receiving an acoustic surface wave propagated on said surface, in which each transducer includes at least one interdigital electrode array, and in which the first transducer includes two extra electrodes on said surface of the body, each of said extra electrodes being near a respective one side of the first transducer but electrically connected to the respective opposite side of the first transducer at right angles to the direction of propagation of the acoustic surface waves, the arrangement being such that when both transducers are operated in a push-pull mode each extra electrode is always of opposite polarity to the adjacent side of the first transducer so as to substantially reduce unwanted capacitive signal breakthrough from the launching to the receiving transducer.

According to a feature of the invention, the electrical connections between the extra electrodes and the respective opposite sides of the first transducer are preferably formed on the surface of the body without crossovers.

According to the invention there is also provided an acoustic surface wave device as defined above, modified in that the first and second transducers are respectively arranged for receiving and launching an acoustic surface wave.

Figure 2:
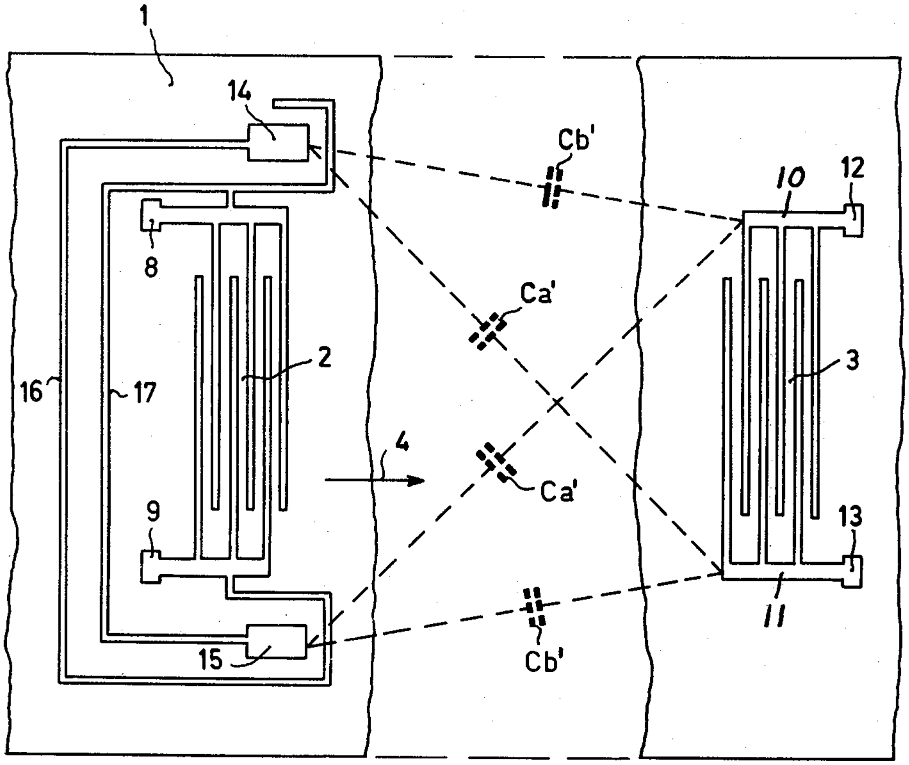

An embodiment of the invention will now be described with reference to the accompanying drawing, in which:

FIG. 1 shows schematically in plan view a conventional acoustic surface wave filter, and FIG. 2 shows schematically in plan view the filter of FIG. 1. modified according to the invention.

Referring now to FIG. 1, a body 1 in the form of a wafer of piezoelectric material has applied to its upper surface a launching transducer 2 and a receiving transducer 3. The transducers comprise arrays of interdigital electrode pairs formed on the surface of the body 1, suitably by photolithography from a vapour deposited layer of metal.

The launching transducer 2 is a conventional single section interdigital electrode array adapted to direct a beam of acoustic surface waves at the receiving transducer 3, parallel to the acoustic surface wave propagation direction 4. The receiving transducer 3 is also a conventional single section interdigital electrode array and is adapted to receive the beam of acoustic surface waves launched by the transducer 2.

Each of the arrays 2 and 3 can be designed in a conventional manner and the equivalent source strength provided by each component pair of interdigital strip electrodes 5 may be predetermined by adjusting the width and/or the overlap in the propagation direction of each electrode strip with an adjacent strip or opposite polarity.

Parallel conductive strips 6, 7 connect together ends of electrodes 5 of the same polarity and lead to respective input terminals 8, 9 of the launching transducer 2. Parallel strips 10, 11 connect together ends of electrodes 5 of the same polarity and lead to respective output terminals 12, 13 of the receiving transducer 3.

The unwanted capacitive breakthrough signal which occurs when the above-described conventional arrangement is both driven and received in a push-pull mode of operation will now be considered.

The total effect of the electrostatic fields between the various electrodes of the two transducers can be represented by equivalent capacitances $Ca$ and $Cb$. $Ca$ is the capacitance between the electrodes 5 connected by the strip 6 and the electrodes 5 connected by the strip 10, and is also the capacitance between the electrodes 5 connected by the strip 7 and the electrodes 5 connected by the strip 11. $Cb$ is the capacitance between the electrodes 5 connected by the strip 6 and the electrodes 5 connected by the strip 11, and is also the capacitance between the electrodes 5 connected by the strip 7 and the electrodes 5 connected by the strip 10. These unwanted capacitances $Ca$ and $Cb$ induce voltages $Va$ and $Vb$ on the receiving transducer the net effect of which constitutes the breakthrough signal. The push-pull operation of the launching transducer 2 will induce an instantaneous voltage $Va - Vb$ at terminal 12 together with a voltage $Vb - Va$ at terminal 13, and the pushpull operation of the receiving transducer results in a breakthrough signal of magnitude $2(Va - Vb)$.

Referring now to FIG. 2, there is shown the filter arrangement of FIG. 1 modified according to the invention by the provision of two extra electrodes 14 and 15. Each of these extra electrodes is near a respective side of the transducer 2 but electrically connected to the opposite side of the transducer 2 at right angles to the propagation direction of acoustic suface waves. Thus when the transducer 2 is operated in a push-pull mode each extra electrode 14, 15 is always of opposite polarity to the adjacent side of the transducer 2. The electrical connections 16, 17 between the extra electrodes 14, 15 and the respective opposite sides of the transducer 2 are preferably formed on the surface of the body 1 without cross-overs and at the same time as the interdigital electrode arrays and extra electrodes.

The electrodes 14, 15 cause additional breakthrough via equivalent capacitances $Ca'$ and $Cb'$ which induce voltages $Va'$ and $Vb'$ respectively on the receiving transducer 3. $Ca'$ is the capacitance between the extra electrode 14 and the electrodes 5 connected by the strip 11, and is also the capacitance between the extra electrode 15 and the electrodes 5 connected by the strip 10. $Cb'$ is the capacitance between the extra electrode 14 and the electrodes 5 connected by the strip 10, and is also the capacitance between the extra electrode 15 and the electrodes 5 connected by the strip 11. It is known that $Ca$ is greater than $Cb$, and clearly $Cb'$ is greater than $Ca'$. The area of the electrodes 14, 15 and their position is arranged so that the condition $Ca + Ca' = Cb + Cb'$ is true. The anti-phase capacitive breakthrough from the additional electrodes 14 and 15 thus results in a net breakthrough voltage, when the receiving transducer 3 is operated in a push-pull mode, of $2\ (Va - Vb - Vb' + Va')$ which, in theory, is equal to zero. In practice there will at least be a substantial reduction of the breakthrough signal.

Some possible modifications to the above described arrangement are as follows.

Although both the launching transducer 2 and the receiving transducer 3 have been shown as a single section interdigital electrode arrays, either or both could be instead double section arrays as long as the two sections are connected in series and operated in a pushpull mode. Another possible modification is to operate the transducer 3 as a launcher and the transducer 2 as a receiver. In some applications it may be desirable to further reduce the unwanted capacitive breakthrough signal, for example by including a grounded strip in between the two transducer which has a screening effect.

What we claim is:

1. An acoustic surface wave device comprising a body of piezoelectric material on one surface of which is arranged a first and a second transducer for respectively launching and receiving an acoustic surface wave propagated on said surface, in which each transducer includes at least one interdigital electrode array, one of said transducers including two extra electrodes on said surface of the body, each of said extra electrodes being positioned near a respective side of said one transducer in a direction approximately perpendicular to the surface wave propagation direction but electrically connected to the respective opposite side of said one transducer, so that when both transducers are operated in a push-pull mode each extra electrode is always of opposite polarity to the adjacent side of the one transducer so as to substantially reduce unwanted capacitive signal breakthrough from the launching to the receiving transducer.

2. An acoustic surface wave device as claimed in claim 1, in which the electrical connections between the extra electrodes and the respective opposite sides of said one transducer are formed on the surface of the body without cross-overs.

3. An acoustic surface wave device as claimed in claim 1 modified so that the first and second transducers are respectively arranged for receiving and launching an acoustic surface wave.

4. An acoustic surface wave device comprising a body of piezoelectric material having an acoustic surface wave propagation surface, first and second transducers each comprising at least one interdigital electrode array positioned on said propagation surface for respectively launching and receiving an acoustic surface wave on said surface, a first auxiliary electrode positioned on said surface near one side of one of said transducers and out of the surface wave propagation path, means electrically connecting the first auxiliary electrode to the opposite side of said one transducer, a second auxiliary electrodes positioned on said surface near the opposite side of said one transducer and out of the surface wave propagation path, and means electrically connecting the second auxiliary electrode to the one side of said one transducer whereby push-pull operation of said one transducer causes each auxiliary electrode to be of opposite electrical polarity to the adjacent side of the one transducer thereby to reduce capacitive signal breakthrough between the launching and receiving transducers.

5. An acoustic surface wave device as claimed in claim 4 wherein said electrical connecting means comprise first and second electric conductors formed on the propagation surface without any crossovers.

* * * * *